(12) United States Patent
Koizumi

(10) Patent No.: US 6,956,273 B2
(45) Date of Patent: Oct. 18, 2005

(54) PHOTOELECTRIC CONVERSION ELEMENT AND SOLID-STATE IMAGE SENSING DEVICE, CAMERA, AND IMAGE INPUT APPARATUS USING THE SAME

(75) Inventor: Toru Koizumi, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/407,264

(22) Filed: Apr. 4, 2003

(65) Prior Publication Data

US 2003/0189237 A1 Oct. 9, 2003

(30) Foreign Application Priority Data

Apr. 5, 2002 (JP) ........................................ 2002-104028

(51) Int. Cl.$^7$ .......................... H01L 31/00; H01L 31/06
(52) U.S. Cl. .................... 257/440; 257/461; 257/463; 257/438; 257/458; 257/185; 257/59; 257/21; 257/186; 257/338.4
(58) Field of Search ................................ 257/461, 463, 257/438, 458, 185, 440, 59, 21, 186, 338.4

(56) References Cited

U.S. PATENT DOCUMENTS

| | | | | |
|---|---|---|---|---|
| 3,860,956 A | * | 1/1975 | Kubo et al. | 348/293 |
| 5,121,183 A | * | 6/1992 | Ogasawara et al. | 257/21 |
| 5,500,550 A | * | 3/1996 | Morishita | 257/461 |
| 5,644,124 A | * | 7/1997 | Hamada et al. | 250/216 |
| 5,667,597 A | * | 9/1997 | Ishihara | 136/258 |
| 5,723,877 A | * | 3/1998 | Sugawa et al. | 257/59 |
| 5,841,180 A | * | 11/1998 | Kobayashi et al. | 257/448 |
| 5,880,494 A | * | 3/1999 | Watanabe | 257/225 |
| 5,965,675 A | | 10/1999 | Kellum et al. | |
| 5,965,875 A | * | 10/1999 | Merrill | 250/226 |
| 6,153,823 A | * | 11/2000 | Shiozaki et al. | 136/249 |
| 6,501,062 B2 | * | 12/2002 | Tashiro | 250/208.1 |
| 6,606,120 B1 | * | 8/2003 | Merrill et al. | 348/273 |
| 2003/0173582 A1 | * | 9/2003 | Hatano et al. | 257/184 |

* cited by examiner

Primary Examiner—Nathan J. Flynn
Assistant Examiner—Fazli Erdem
(74) Attorney, Agent, or Firm—Morgan & Finnegan, LLP

(57) ABSTRACT

In a photoelectric conversion element which is formed by alternately stacking a region of a first conductivity type and a region of a second conductivity type as a conductivity type opposite to the first conductivity type to form a multi-layered structure, in which junction surfaces between the neighboring regions of the first and second conductivity types are formed to have depths suited to photoelectrically convert light in a plurality of different wavelength ranges, and which outputs signals for respective wavelength ranges, a region of a conductivity type opposite to the conductivity type of a surface-side region of the junction surface closest to a surface is formed in the surface of the surface-side region. Thus, highly color-separable signals which suffer less color mixture upon reading out signals from a plurality of photodiode layers is read out.

12 Claims, 15 Drawing Sheets

F I G. 3
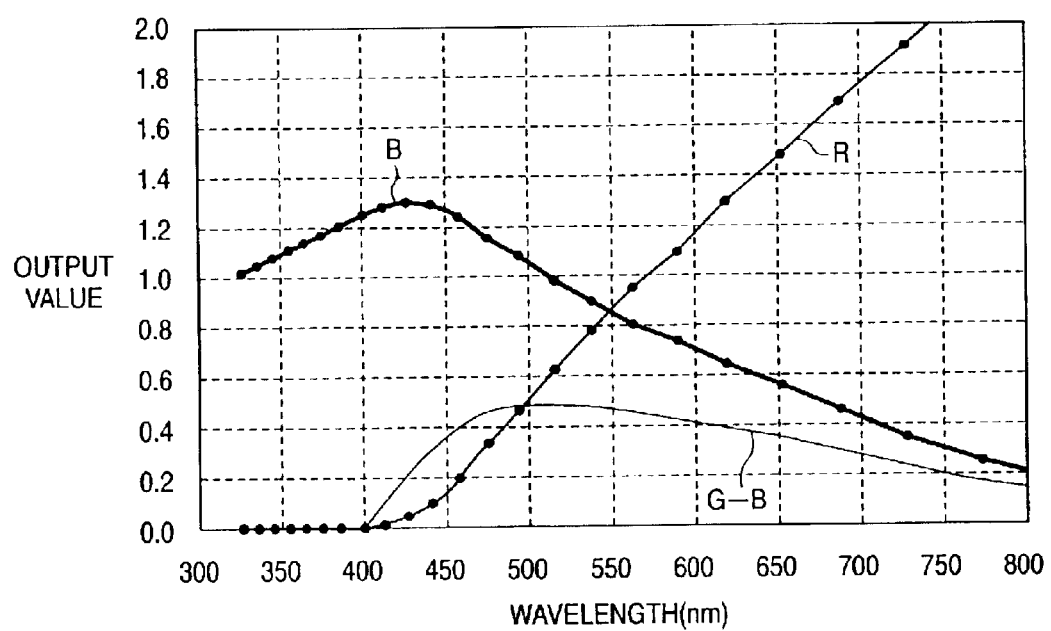

FIG. 7A

| Cy FILTER | Ye FILTER |
|---|---|
| B/G | G/R |
| Ye FILTER | Cy FILTER |
| G/R | B/G |

FIG. 7B

| G FILTER | Mg FILTER |
|---|---|
| G | B/R |
| Mg FILTER | G FILTER |
| B/R | G |

PHOTOELECTRIC CONVERSION ELEMENT AND SOLID-STATE IMAGE SENSING DEVICE, CAMERA, AND IMAGE INPUT APPARATUS USING THE SAME

FIELD OF THE INVENTION

The present invention relates to an image sensing device and, more particularly, to a photoelectric conversion element and solid-state image sensing device prevalently used in image input apparatuses such as a video camera, digital still camera, scanner, and the like.

BACKGROUND OF THE INVENTION

Conventionally, various proposals for improving the resolution and realizing a size reduction of an image sensing device in solid-state image sensing elements used in image sensing devices such as a digital camera and the like have been made. As one of such solid-state image sensing element, the structure of a MOS image sensing element capable of acquiring R, G, and B color components from respective pixels at the same time is disclosed in U.S. Pat. No. 5,965,875. This image sensing device will be briefly explained below.

FIG. 11 shows the structure of a solid-state image sensing element disclosed in U.S. Pat. No. 5,965,875, i.e., a photodiode for each pixel, which is formed to have a three-layered structure (triple-well structure). Referring to FIG. 11, reference numeral 100 denotes a p-type silicon substrate; 102, an n-well formed on the silicon substrate 100; 104, a p-well formed on the n-well 102; and 106, an n-type region. Reference numeral 108 denotes a photocurrent sensor, which has an ammeter 110 for detecting a current of a red (R) component, an ammeter 112 for detecting a current of a green (G) component, and an ammeter 114 for detecting a current of a blue (B) component.

As shown in FIG. 11, in the photodiode, three layers of pn-junction diodes are formed in the depth direction of silicon by deeply forming an n-type layer, p-type layer, and n-type layer in the order named, which are diffused in turn from the surface of the p-type silicon substrate. Light components which have entered the diode from the surface side intrude deeper as they have longer wavelengths, and the incoming wavelength and attenuation coefficient exhibit values unique to silicon. Hence, the depths of pn-junctions of the photodiode with the three-layered structure are designed to cover respective wavelength ranges (R, G, B) of visible light, and currents are independently detected from three layers of the photodiode, thus detecting photo signals of different wavelength ranges.

FIG. 12 is a potential graph of the photodiode with the three-layered structure shown in FIG. 11. The abscissa plots the depth, and the ordinate plots the potential. Note that depths A to D correspond to those shown in FIG. 11.

Since light components that have entered the photodiode with the three-layered structure from the surface side can reach deeper positions as they have longer wavelengths, the region between surface O and depth A mainly accumulates electrons produced by light of the B component having a shorter wavelength, the region between surface O and depth B mainly accumulates holes produced by light of the G component having a middle wavelength, and the region between depths A and D mainly accumulates electrons produced by light of the R component having a longer wavelength.

FIGS. 13A and 13B show a read circuit for reading out charges from the photodiode with the three-layered structure shown in FIG. 11. FIG. 13A schematically shows the read circuit, and FIG. 13B is an equivalent circuit diagram of that circuit. This read circuit can read out charges accumulated on the photodiode. FIG. 14 shows another example of a read circuit for reading out charges from the photodiode with the three-layered structure shown in FIG. 11.

The three readout signals then undergo color signal separation by arithmetic processes, thus reproducing an image.

However, in the conventional structure, holes produced in the region between surface O and depth B, i.e., holes produced by light of the B component in a shallow region close to the surface, and holes produced by light of the G component in a slightly deeper region mix, resulting in color mixture.

FIG. 15A shows the simulation results of signal values obtained upon irradiating the photodiode with the three-layered structure shown in FIG. 11 with light. The solid curves indicate outputs directly obtained from an output circuit, and the broken curves indicate signal values obtained by executing color signal separation by arithmetic processes of obtained signals. Note that a DN output indicates an output from the uppermost photodiode layer, a PWL output indicates an output from the middle photodiode layer, and a NWL output indicates an output from the lowermost photodiode layer.

As described above, in the PWL output from the middle photodiode layer, since the B component mixes with the G component, the G component is separated by calculating PWL output+DN output as a G component signal. At this time, since the PWL output corresponds to holes and the DN output corresponds to electrons, PWL output+DN output= the number of PWL holes—the number of DN electrons, i.e., a subtraction is made in practice. However, since arithmetic operations of the two outputs must be made, noise $\sqrt{2}$ times that of the read circuit is contained in the G component signal. Also, since the DN output contains many noise components produced by a dark current, the noise of the important G component signal gets worse under their influence.

Likewise, since the NWL output cannot directly used as an R component signal due to poor color separation, NWL output+PWL output+DN output is calculated to obtain the R component signal, thus obtaining the spectral characteristics indicated by broken curve R in FIG. 15. However, as a result of this arithmetic operation, the R component signal contains noise $\sqrt{3}$ times that of the read circuit. In addition, since the DN output contains many noise components produced by a dark current, the noise of the R component signal gets worse under the influence of them.

FIG. 15B shows spectral characteristics obtained by calculating, using the DN, PWL, and NWL outputs via an infrared cut filter, B component signal=DN output=the number of DN electrons, G component signal=PWL output+DN output=|the number of PWL holes—the number of DN electrons|, and R component signal=NWL output+PWL output+DN output=|the number of NWL electrons–the number of PWL holes+the number of DN electrons|, and then adjusting their gains.

As described above, the photodiode with the three-layered structure can detect light components in different wavelength ranges by setting different depths of pn-junctions. However, the wavelength ranges to be photoelectrically converted of three obtained signals largely overlap each other. For example, when the middle photodiode layer is designed to have peak sensitivity around G color (545 nm), this photodiode layer also photoelectrically converts a photo signal near R color (630 nm) and a photo signal near B color (450 nm) at a ratio of several 10%. When signals which considerably suffer color mixture undergo arithmetic processes, color reproducibility deteriorates, and is readily influenced by noise.

Also, the gain of each photodiode, i.e., the voltage change amount of a photodiode produced per unit charge amount is inversely proportional to pn-junction capacitance C of that photodiode. Since the three photodiode layers inevitably have different areas, and the pn-junction capacitance per unit area also depends on the concentration of each diffusion layer, it is difficult to match the capacitances of the three photodiode layers. Therefore, since the three readout photo signals have different gains, they are hard to process in terms of signal arithmetic operations.

Of the three photodiode layers, two photodiode layers which neighbor in the vertical direction are capacitively coupled via a pn-junction. As charges produced by photoelectric conversion are accumulated in each photodiode layer, the capacitance of that photodiode layer changes. For this reason, the potential of a given photodiode layer is also influenced by a charge amount accumulated on another photodiode layer. For this reason, the linearity of each photodiode layer is disturbed, or changes depending on colors.

More specifically, as shown in FIGS. 13A and 13B, neutral regions are present in the n-type region 106, p-well 104, and n-well 102, and capacitances $C_1$, $C_2$, and $C_3$ are present in their junctions. In addition, when the conventional read circuit shown in FIGS. 13A and 13B reads out voltage signals, parasitic capacitances $C_1'$, $C_2'$, and $C_3'$ of the read circuit are added. As a result, voltages to be read out of respective outputs are read out as complicated voltages in which capacitances $C_1$ to $C_3$ and $C_1'$ to $C_3'$, and the DN, PWL, and NWL outputs influence each other. That is, the read gains from respective outputs are different from each other, and each output is influenced by other outputs. More specifically, even if the number of NWL electrons is zero, when DN electrons are produced, the NWL output is not zero, but a value=DN charge/$(C_1+C_1')$ is output.

Also, when voltage signals are read out by the read circuit shown in FIG. 14, the DN, PWL, and NWL outputs influence each other due to the presence of capacitances $C_1$ to $C_3$ of the junctions of the n-type region 106, p-well 104, and n-well 102, and parasitic capacitances $C_1'$ to $C_3'$, and read gains are different from each other.

When signal values read out in this way are used, even when arithmetic operations for obtaining broken curves G and R in FIG. 15A are made, high-quality signal values G and R cannot be obtained.

SUMMARY OF THE INVENTION

The present invention has been made in consideration of the aforementioned problems, and has as its first object to read out highly color-separable signals which suffer less color mixture upon reading out signals from a plurality of photodiode layers.

It is the second object of the present invention to reduce the gain differences upon reading out respective color signals.

In order to achieve the first object, a photoelectric conversion element of the present invention is formed by alternately stacking a region of a first conductivity type and a region of a second conductivity type as a conductivity type opposite to the first conductivity type to form a multilayered structure, in which junction surfaces between the neighboring regions of the first and second conductivity types are formed to have depths suited to photoelectrically convert light in a plurality of different wavelength ranges, outputs signals for respective wavelength ranges, and a surface of a surface-side region of the junction surface closest to a surface is covered by a region of a conductivity type opposite to a conductivity type of the surface-side region.

In order to achieve the second object, concentrations of the stacked regions of the first and second conductivity types are set to deplete the regions upon resetting the regions to a predetermined potential.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3 is a graph showing signal outputs read out from the photodiode of the three-layered structure shown in FIG. 1;

FIGS. 7A and 7B show layout examples for four pixels in an area sensor that uses a plurality of photodiode layers according to a second embodiment of the present invention;

DETAILED DESCRIPTION OF THE PREFERRED EMBODIMENTS

Preferred embodiments of the present invention will now be described in detail with reference to the accompanying drawings.

First Embodiment

Figure 1:
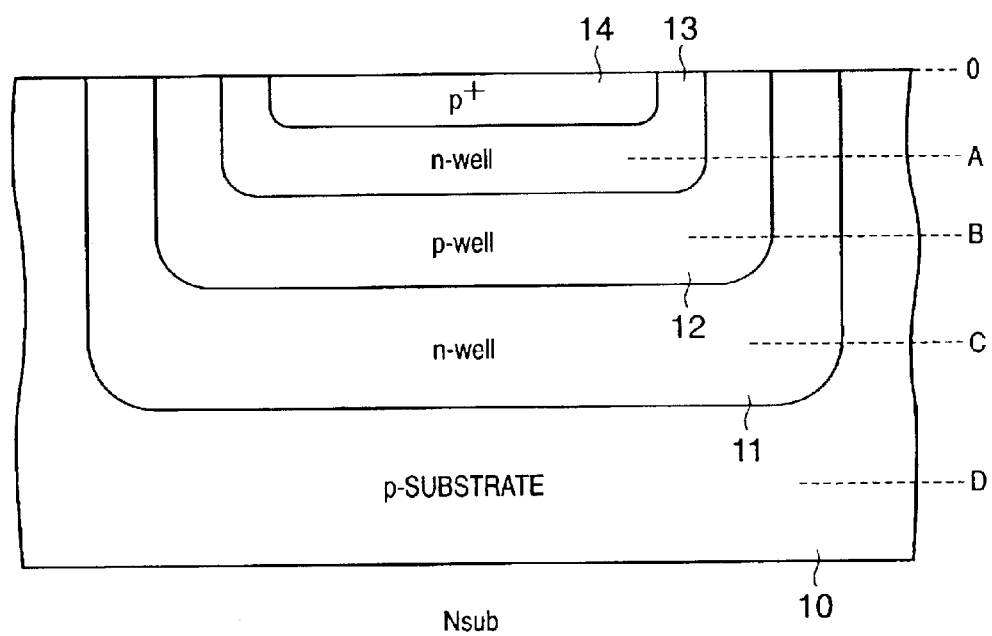
FIG. 1 is a schematic sectional view of one pixel having a three-layered photodiode structure according to a first embodiment of the present invention.

FIG. 1 is a schematic sectional view showing the section of one pixel which has a three-layered photodiode structure according to the first embodiment of the present invention.

Referring to FIG. 1, reference numeral 10 denotes a p-type substrate; 11, an n-type region (n-well) formed on the p-substrate 10; 12, a p-type region (p-well) formed on the n-well 11; 13, an n-type region (n-well) formed on the p-well 12; and 14, a p-type region formed on the n-well 13.

Figure 2:
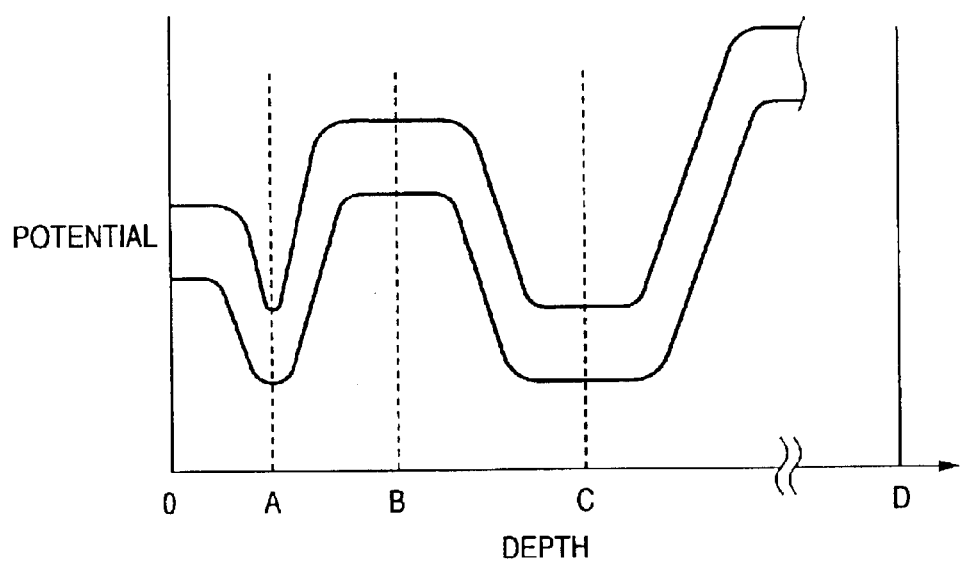
FIG. 2 is a potential diagram of the photodiode of the three-layered structure shown in FIG. 1.

FIG. 2 is a potential diagram of the pixel which has the structure shown in FIG. 1. The abscissa plots the depth, and the ordinate plots the electrical potential. Note that depths A to D in FIG. 2 correspond to those shown in FIG. 1.

Since light components which enter from the pixel surface reach deeper positions as they have longer wavelengths, the region between surface O and depth B mainly accumulates electrons produced by light of a blue (to be abbreviated as B hereinafter) component with a shorter wavelength, the region between depths A and C mainly accumulates holes produced by light of a green (to be abbreviated as G hereinafter) component with a middle wavelength, and the region between depths B and D mainly accumulates electrons produced by light of a red (to be abbreviated as R hereinafter) component with a longer wavelength. Charges accumulated on these regions are read out.

As can be seen from FIG. 2, since the p-layer is formed in the pixel surface, as shown in FIG. 1, to increase the electrical potential of the surface, holes produced near the surface, i.e., holes and a dark current produced mainly by light of the B component can be trapped in the region between surface O and depth A. In this manner, light of the G component accumulated on the region between depths A and C can be prevented from mixing with the holes and dark current produced mainly by light of the B component. On the other hand, since electrons produced in the p-layer in the surface owing to light of the B component are accumulated on the region between surface O and depth A, an output signal of the B component can be maintained at the same level as that of the conventional circuit.

FIG. 3 shows the spectral characteristics obtained when depths A to C are respectively set to A=0.5 μm, B=1.0 μm, and C=1.2 μm. As can be seen from FIG. 3, satisfactory color separation can be realized without any arithmetic processes of the three readout signals unlike in the prior art.

Figure 4:
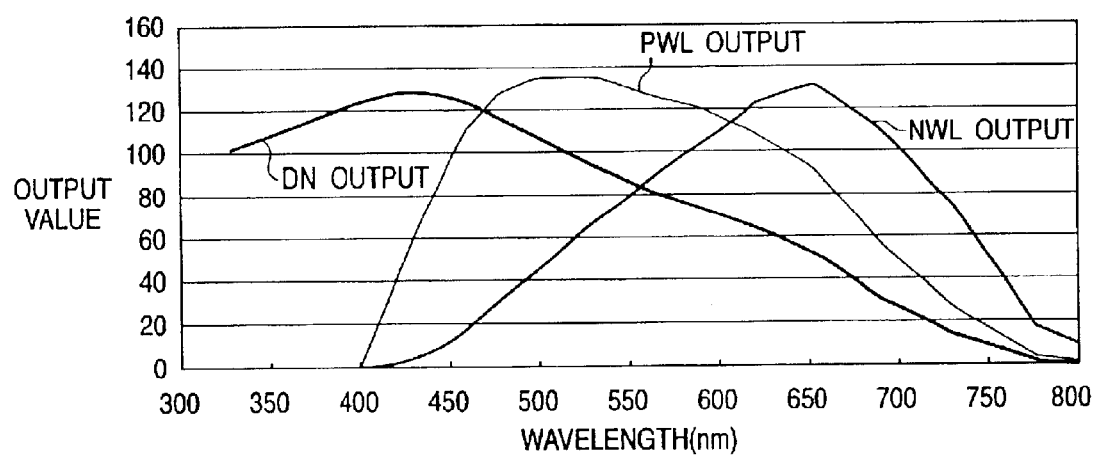
FIG. 4 is a graph showing signal outputs obtained by adjusting the gains of the signal outputs shown in FIG. 3.

The spectral characteristics shown in FIG. 4 are obtained by simply adjusting the gains of respective outputs without any arithmetic operations. In this manner, low-noise signals on which noise components of a read system and a dark current are not superposed can be obtained.

In the above description, the photodiode with the three-layered structure has been explained. However, the present invention is not limited to such specific structure, and a photodiode having an arbitrary number of layers (e.g., a two-layered structure, four-layered structure, and the like) can be formed. In the above description, the p-region is formed in the surface. However, it is important to form a region having a conductivity type opposite to that of a region on the surface side of the uppermost photodiode in the surface of a given photodiode. Hence, if the region on the surface side of the uppermost photodiode is of p type, a surface region must be of n type.

Figure 5A:
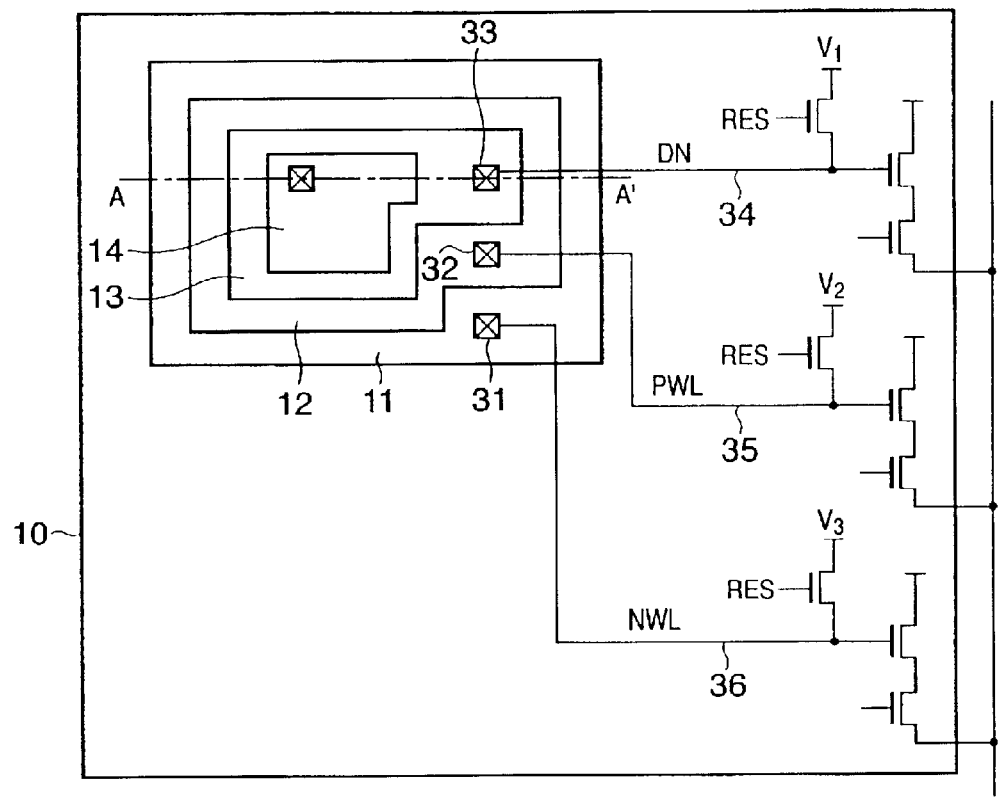
FIGS. 5A and 5B are views for explaining one pixel of the photodiode of the three-layered structure, and its read circuit according to the first embodiment of the present invention.
Figure 5B:
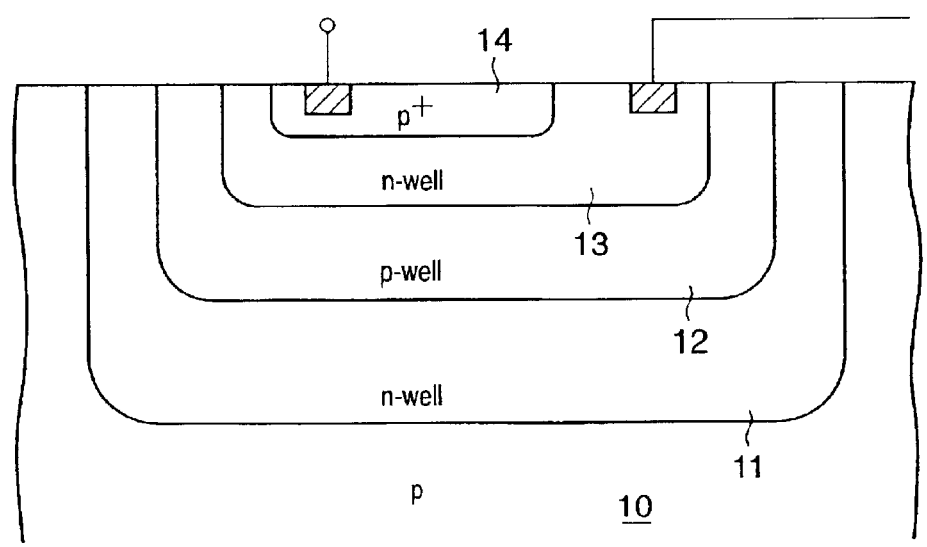

FIGS. 5A and 5B are views for explaining one pixel of the photodiode of the three-layered structure shown in FIG. 1, and its read circuit. More specifically, FIGS. 5A depicts the plan structure of the photoelectric conversion unit shown in FIG. 1, and illustrates an equivalent read circuit together. FIG. 5B shows a cross sectional view taken along a line between A and A' in FIG. 5A. The same reference numerals denote the same parts as those in FIG. 1, and a description thereof will be omitted. Reference numeral 31 to 33 denote electrodes; 34, a DN output line; 35, a PWL output line; and 36, an NWL output line.

Figure 13A:
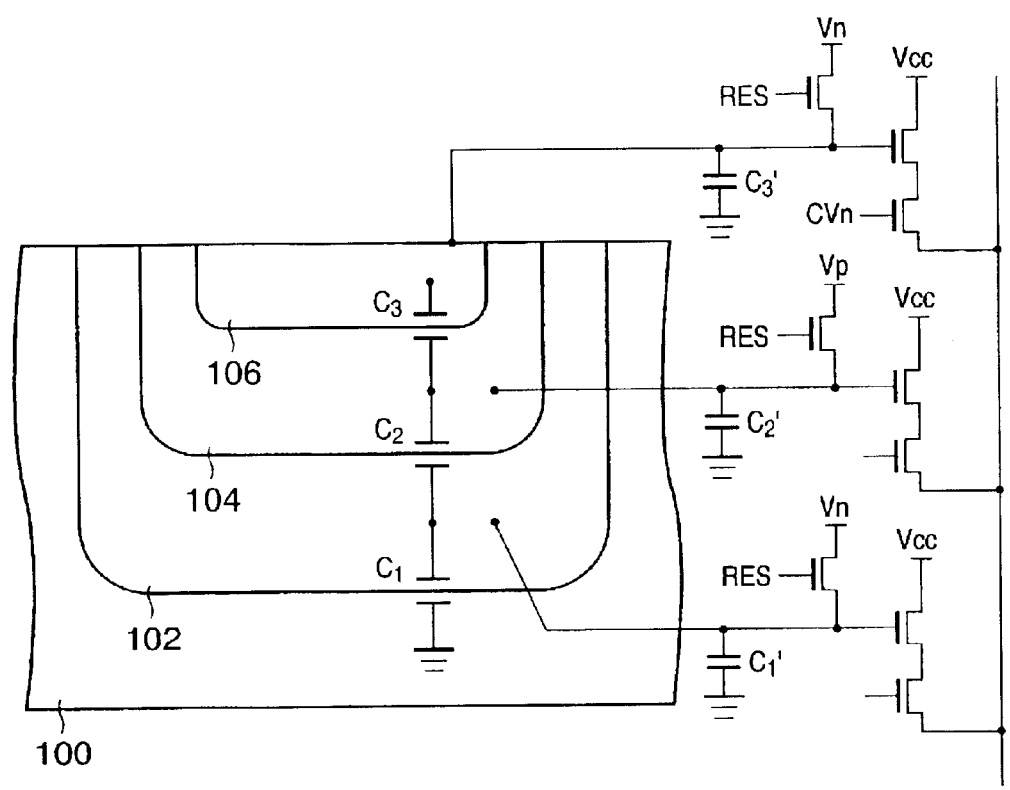
FIGS. 13A and 13B are diagrams showing a read circuit for reading out charges from the photodiode of the three-layered structure shown in FIG. 11.
Figure 13B:
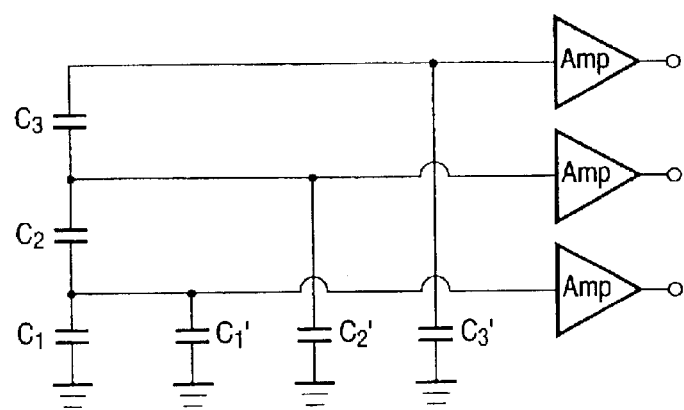

In the structure shown in FIG. 5A, the concentrations of the n-well 13, p-well 12, and n-well 11 are set so that they are depleted upon application of a predetermined reset voltage, and the output electrodes 31 to 33 are connected to the respective regions. When the predetermined reset voltage is applied, the n-well 13, p-well 12, and n-well 11 are depleted, and the capacitances of respective junctions are minimized. In this way, capacitances $C_1$ to $C_3$ produced at the junction surfaces as shown in FIG. 13 can be minimized, and the DN, PWL, and NWL outputs can be prevented from influencing each other.

When the above structure is designed so that, for example, capacitances produced in respective junctions become equal to each other upon resetting the DN output line 34, PWL output line 35, and NWL output line 36 to $V_1=3$ V, $V_2=1$ V, and $V_3=3$V, respectively, and the respective regions are depleted upon application of a reverse bias of 0.5 V, charges corresponding to at least C'×0.5 (C=C1'=C2'=C3') can be satisfactorily read out from photodiodes formed of the respective junctions. Note that C is an effective capacitance produced at each junction surface.

Note that the reset voltages of the DN output line 34, PWL output line 35, and NWL output line 36 are not limited to 3 V, 1 V, and 3V, and can be adjusted as needed.

As a result, although full charge transfer is difficult to attain, most of generated charges can be read out to designed external capacitances. Note that the respective regions have electrodes, but these electrodes have no influences since they are eventually connected to the ground via depletion layers. Since charges can be read out to parasitic capacitances $C_1'$ to $C_3'$ of the read circuit, which can be designed independently of the junction capacitances of the n-well 13, p-well 12, and n-well 11, signals to be output can have approximately uniform read gains.

Figure 14:
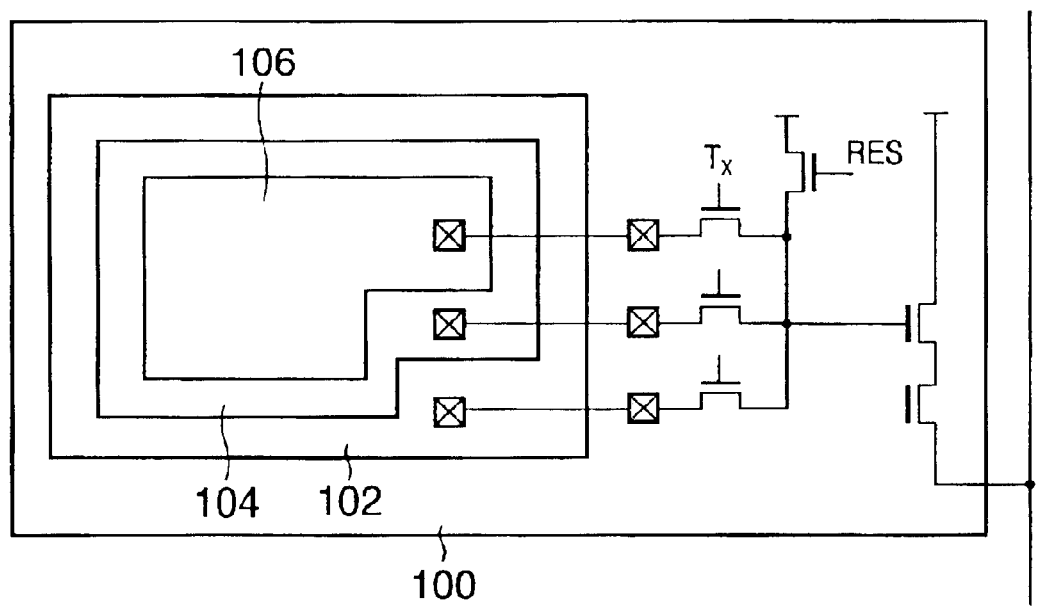
FIG. 14 is a diagram showing another read circuit for reading out charges from the photodiode of the three-layered structure shown in FIG. 11.
Figure 15A:
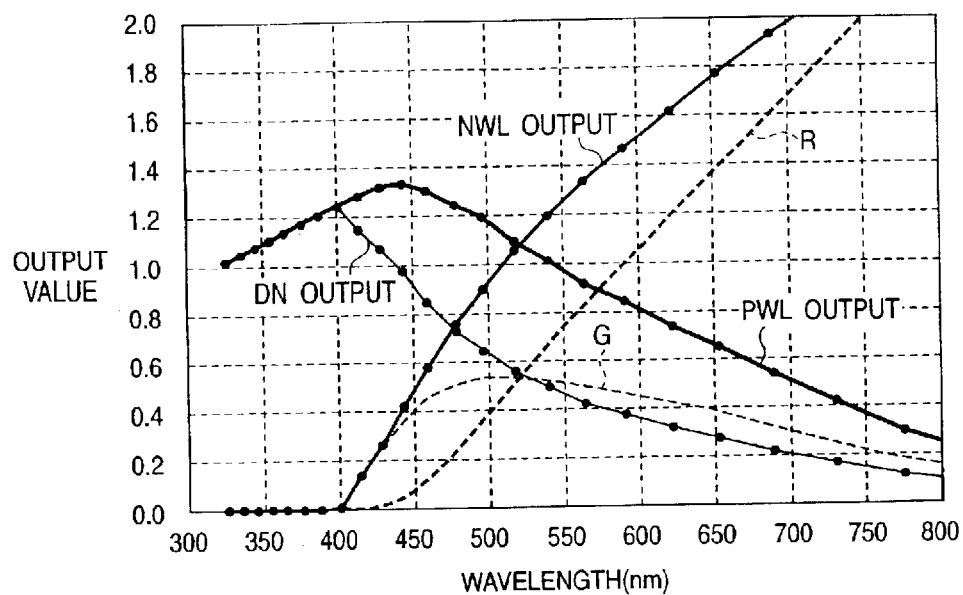
FIGS. 15A and 15B are graphs showing the simulation results of signal values obtained upon irradiating the conventional photodiode of the three-layered structure with light.
Figure 15B:
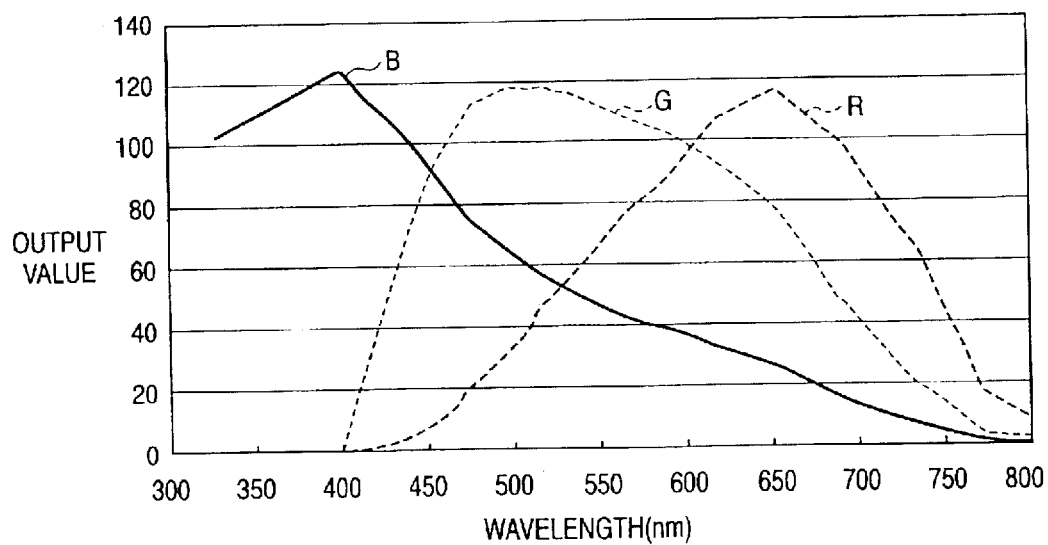

Note that the similar effect as in the above embodiment can be obtained when the structure in which the concentrations of the n-well 13, p-well 12, and n-well 11 are set so that these wells are depleted upon application of predetermined reset voltages is combined with the read circuit arrangement using a transfer switch shown in FIG. 14.

<Modification>

Figure 6:
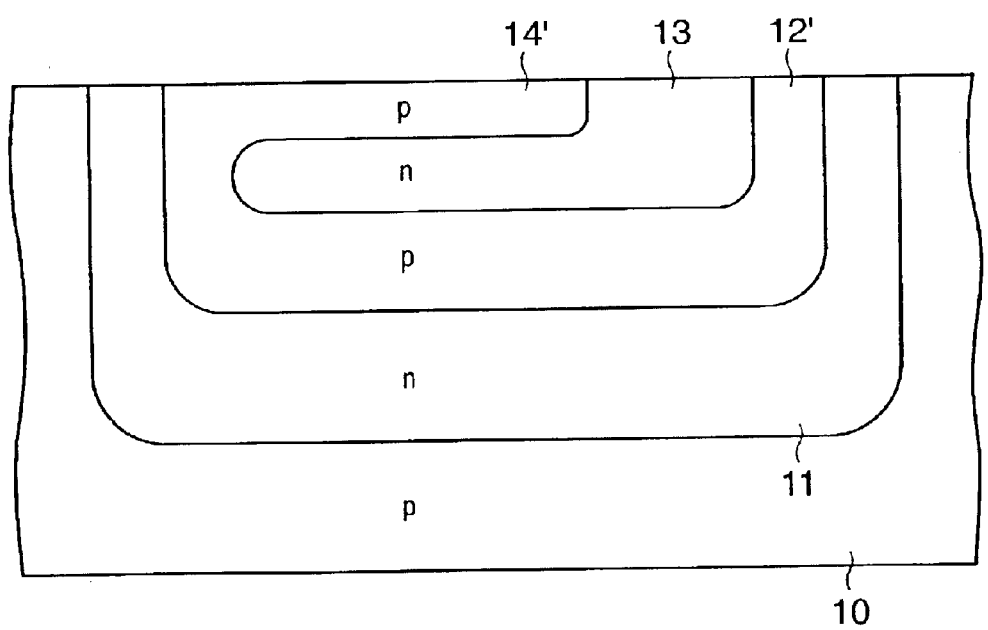
FIG. 6 is a schematic sectional view of one pixel having a three-layered photodiode structure according to a modification of the present invention.

FIG. 6 is a schematic sectional view showing another structure of the three-layered photodiode structure according to the present invention. The same reference numerals in FIG. 6 denote the same parts as those in FIG. 1, and a description thereof will be omitted. The structure shown in FIG. 6 is different from FIG. 1 in that a p-type region 14' on the surface side is partially connected to a p-well 12'.

With this structure, the same effect as in the first embodiment can be obtained.

Second Embodiment

The first embodiment has explained the photodiode with the three-layered structure. However, the present invention is not limited to three layers, and may be applied to a two-layered structure. In the second embodiment, a case will be explained below wherein photodiodes each having a two-layered structure are connected to form a two-dimensional array (to form an area sensor).

FIGS. 7A and 7B show layouts each for four pixels in an area sensor using photodiodes of the two-layered structure. Arbitrary numbers of such layouts are repetitively arranged in the horizontal and vertical directions.

FIG. 7A shows an example in which a pixel that is designed to mainly photoelectrically convert B and G light components (light components within the range from short to middle wavelengths of visible light) at the same time in one pixel (to be referred to as a B/G pixel hereinafter), and a pixel that is designed to mainly photoelectrically convert G and R light components (light components within the range from middle to long wavelengths of visible light) at the same time in one pixel (to be referred to as a G/R pixel hereinafter) are arranged in a checkered pattern. Note that these pixels do not always have the same spectral sensitivity upon mainly photoelectrically converting middle-wavelength light. A cyan (to be abbreviated as Cy hereinafter) filter used to cut the R light component is arranged on the surface of each B/G pixel, and a Yellow (to be abbreviated as Ye hereinafter) filter used to cut the B light component is arranged on the surface of each G/R pixel.

In the layout shown in FIG. 7A, since a G signal serving as a luminance signal can be obtained from each pixel, a prescribed resolution can be maintained.

In this way, by combining the photodiodes of the two-layered structure with filters, signals of target two color components can be obtained per pixel. The signals of two color components per pixel obtained in this way undergo known arithmetic operations and are interpolated between pixels, thus consequently obtaining three color signals per pixel.

FIG. 7B shows an example in which a photodiode of a single-layered structure, which has a G filter arranged on a pixel and mainly photoelectrically converts a G light component (to be referred to as a G pixel hereinafter), and a photodiode of a two-layered structure which has a Magenta (to be abbreviated as Mg hereinafter) filter arranged on a pixel and is designed to mainly photoelectrically convert B and R light components (to be referred to as a B/R pixel hereinafter) are arranged in a checkered pattern.

With this layout, although the resolution is inferior to that of the structures shown in FIGS. 1 and 7A, an image with a higher resolution can be obtained by a simple structure compared to a case wherein photodiodes of a single-layered structure are used.

In the layout shown in FIG. 7A, the photodiodes of the two-layered structure are combined with the color filters. However, the color filters are not always necessary. In this case, color separation can be implemented using signals from neighboring pixels.

Third Embodiment

An image sensing system which uses the image sensing element that has been explained in the first and second embodiments will be explained below with reference to FIG. 8.

Figure 8:
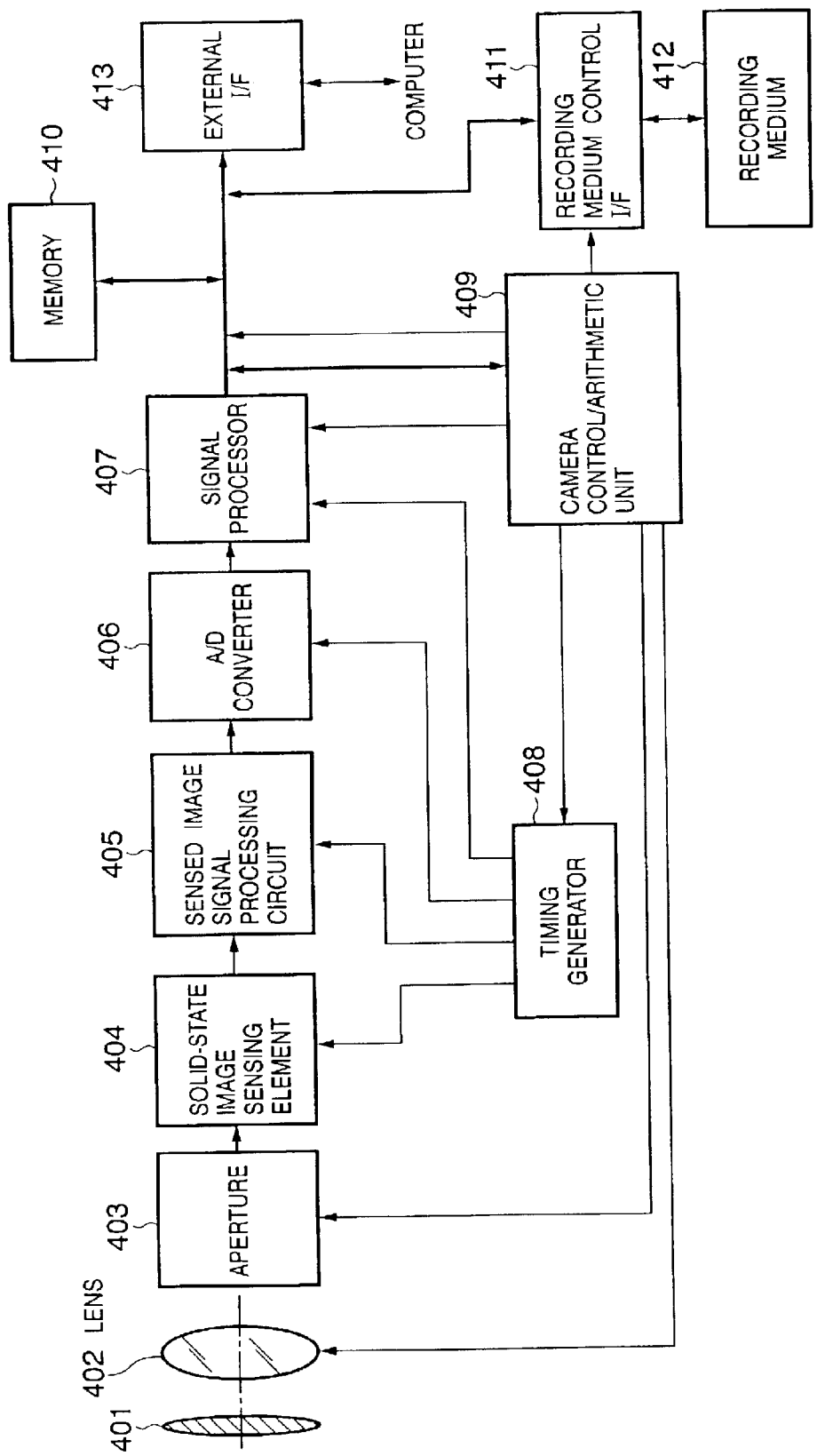
FIG. 8 is a block diagram showing the arrangement of an image sensing system according to a third embodiment of the present invention.

Referring to FIG. 8, reference numeral 401 denotes a barrier which serves as both a lens protection member and a main switch; 402, a lens which forms an optical image of an object on a solid-state image sensing element 404; 403, an aperture used to variably control the amount of light that has passed through the lens 402; 404, a solid-state image sensing element which captures as an image signal the optical image of the object formed by the lens 402; 405, an image signal processing circuit which includes a variable gain amplifier for amplifying an image signal output from the solid-state image sensing element 404, a gain correction circuit for correcting gain values, and the like; 406, an analog-to-digital (A/D) converter which A/D-converts the image signal output from the solid-state image sensing element 404; 407, a signal processor which makes various correction processes of image data output from the A/D converter 406, and compresses the data; 408, a timing generator which outputs various timing signals to the solid-state image sensing element 404, image signal processing circuit 405, A/D converter 406, and signal processor 407; 409, a camera control/arithmetic unit which makes various arithmetic operations, and controls the entire still video camera; 410, a memory which temporarily stores image data; 411, a recording medium control interface which is used to record/read out data on/from a recording medium; 412, a detachable recording medium such as a semiconductor memory or the like on/from which image data is recorded/read out; and 413, an interface which is used to communicate with an external computer or the like.

Figure 9:
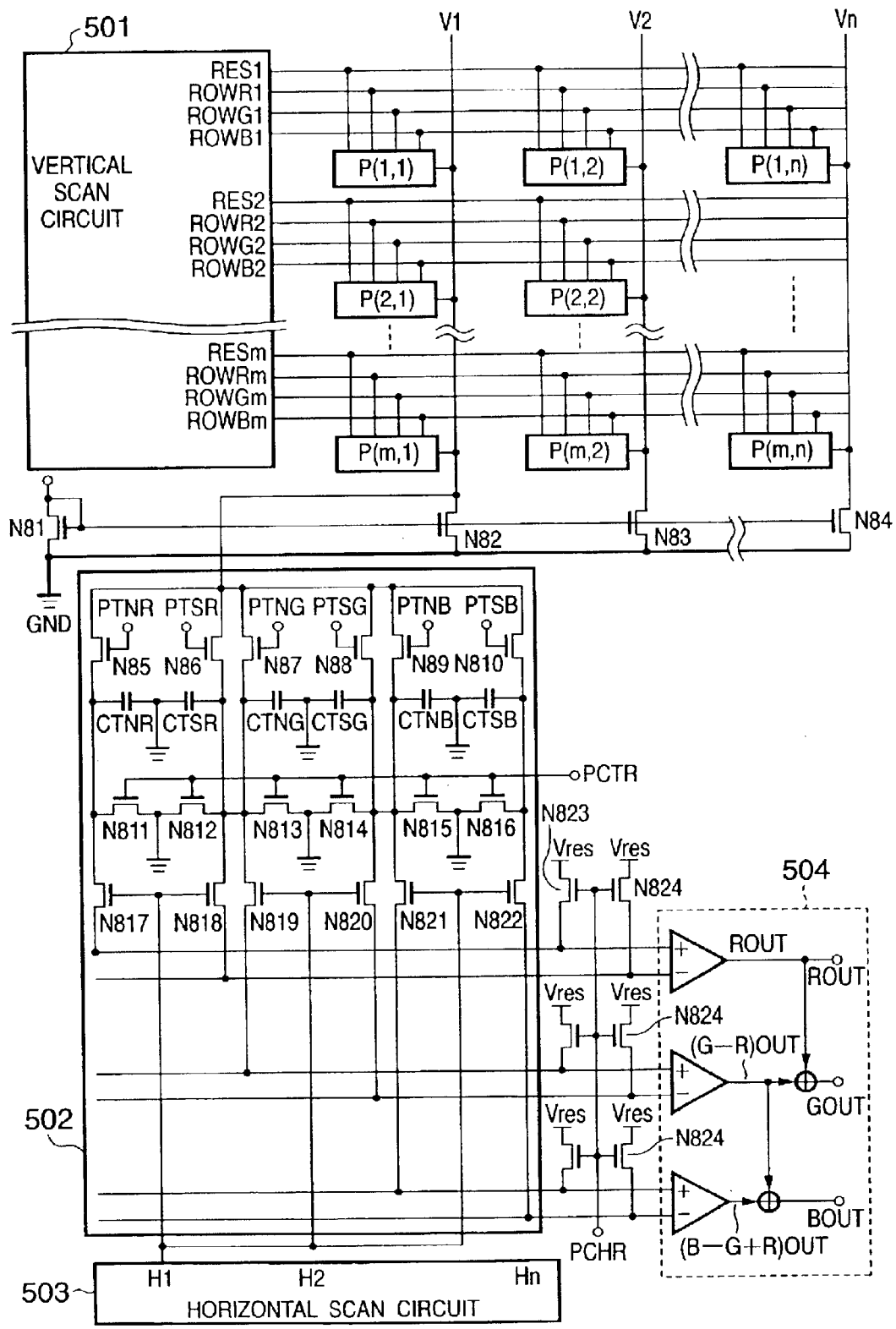
FIG. 9 is a circuit diagram showing an example of the detailed arrangement of a solid-state image sensing element shown in FIG. 8.
Figure 10:
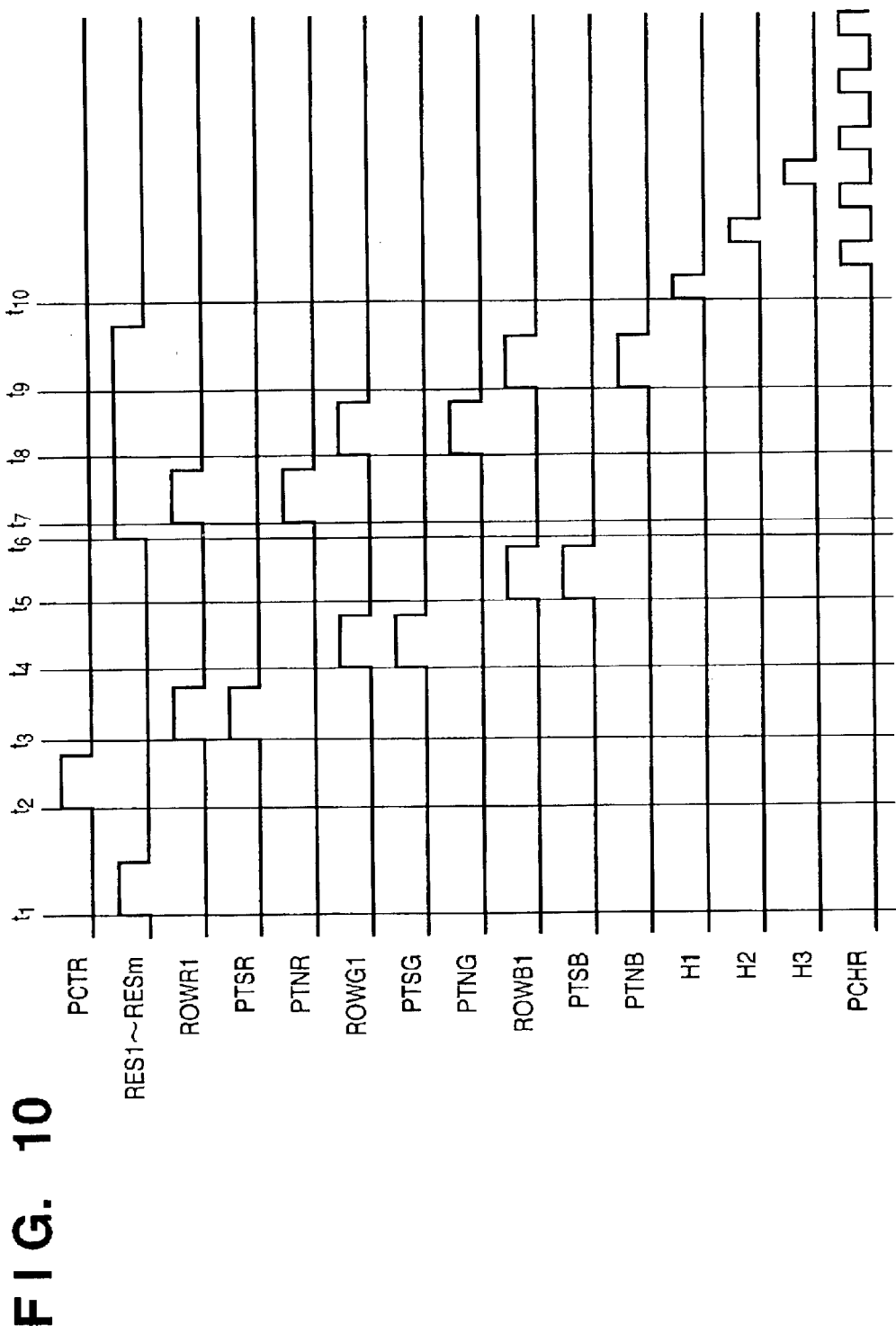
FIG. 10 is a timing chart for driving the solid-state image sensing element shown in FIG. 9.
Figure 11:
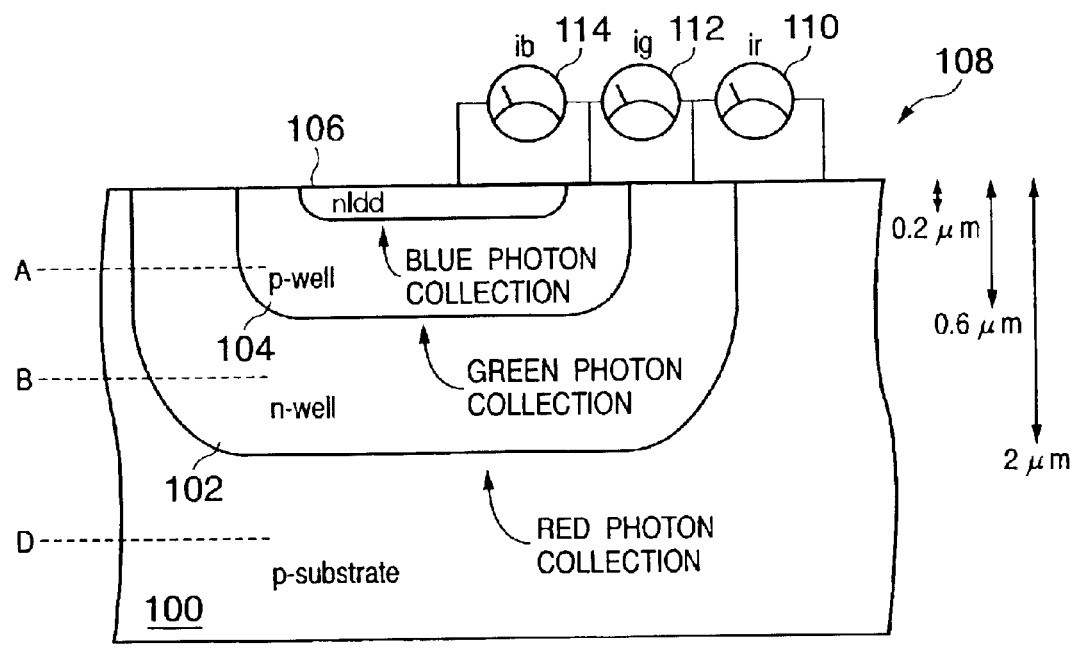
FIG. 11 is a sectional view showing a section of a conventional photodiode of a three-layered structure.
Figure 12:
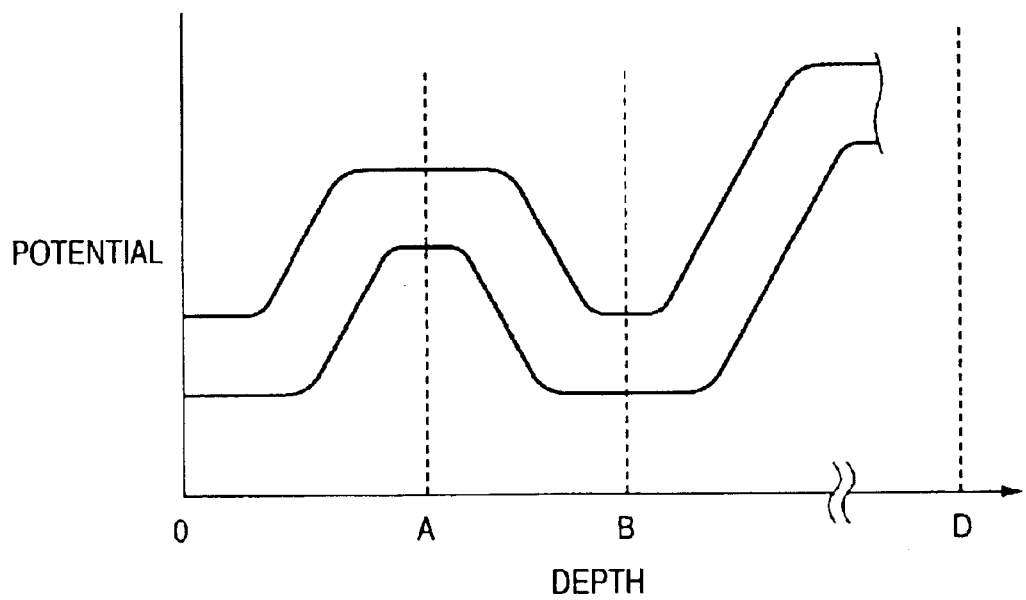
FIG. 12 is a potential diagram of the photodiode of the three-layered structure shown in FIG. 11.

FIG. 9 shows the detailed arrangement of the solid-state image sensing element 404. Each pixel may have the structure explained in the first or second embodiment. However, assume that each pixel has the structure shown in FIGS. 5A and 5B in this embodiment. The arrangement and operation of FIG. 9 will be explained below with reference to the timing chart shown in FIG. 10.

Reference numeral 501 denotes a vertical scan circuit which selects a row that transfers charges accumulated on pixels; and 502, a holding circuit which temporarily holds signal charges transferred from respective pixels and noise components upon resetting respective pixels for respective colors. At this time, the noise components include reset random noise produced upon resetting pixels, fixed pattern noise of a read circuit, and the like. FIG. 9 illustrates only one set of the holding circuit 502, but a plurality of sets of holding circuits 502 are arranged in correspondence with respective columns in practice. Reference numeral 503 denotes a horizontal scan circuit which sequentially transfers charges accumulated on the holding circuit 502 to a signal output unit 504. The signal output unit 504 extracts noise components from the transferred signal charges by a differential process, and outputs respective color signals.

As the operation of the solid-state image sensing element 404, a case will be explained below wherein a charge is read out from a pixel $P_{(1, 1)}$.

At $t_1$, signals RES1 to RESm are changed to High (H) to deplete respective regions of photodiodes. After that, the solid-state image sensing element 404 is exposed for a predetermined period of time. At $t_2$, signal PCTR is changed to H to reset capacitances CTNR, CTSR, CTNG, CTSG, CTNB, and CTSB in the holding circuit 502. After the capacitances are reset, signals ROWR1 and PTSR are changed to H at $t_3$ to transfer a charge obtained by the lowermost photodiode layer to capacitance CTSR. Then, signals ROWG1 and PTSG are changed to H at $t_4$, and signals ROWB1 and PTSB are changed to H at $t_5$, thus reading out charges obtained by the middle and uppermost photodiode layers to capacitances CTSG and CTSB, respectively.

Subsequently, signal RES1 is changed to H again at $t_6$, and signals ROWR1 and PTNR ($t_7$), ROWG1 and PTNG ($t_8$), and ROWB1 and PTNB ($t_9$) are respectively changed in turn to H while maintaining RES1 at H, thereby reading out noise components to capacitances CTNR, CTNG, and CTNB, respectively.

Signal H1 is changed to H at $t_{10}$ to transfer charges in capacitances CTSR and CTNR, CTSG and CTNG, and CTSB and CTNB to corresponding differential amplifiers of the signal output unit 504. The differential amplifiers subtract charges of noise components from charges accumulated upon exposure, and output signal charges.

After that, signals H2 to Hn are changed in turn to H, and signal PCHR is changed to H during the H periods of these signals, thus sequentially transferring charges for one row to the differential amplifiers and outputting differences while resetting lines to the signal output unit 504 to a predetermined potential. By repeating operations after $t_2$ in correspondence with the number of rows, an image signal for one frame can be read out.

Also, only signal RES1 may be changed to H at $t_1$ to delete the regions of photodiodes for one row, and signal RES2 may be changed to H upon driving the next row.

When such driving operation for each row is attained by repeating operations after $t_1$, a rolling shutter drive method that shifts exposure/charge accumulation times for respective rows can be implemented.

The operation of the still video camera upon image sensing in the above arrangement will be explained below.

When the barrier 401 is opened, a main power supply is turned on, a power supply for a control system is then turned on, and a power supply for image sensing system circuits including the A/D converter 406 and the like is then turned on.

After that, in order to control an exposure value, the camera control/arithmetic unit 409 fully opens the aperture 403, and a signal output from the solid-state image sensing element 404 is converted by the A/D converter 406 and is then input to the signal processor 407. The camera control/arithmetic unit 409 makes photometry on the basis of data which has undergone a predetermined signal process by the signal processor 407, determines brightness based on the photometry result, and calculates an exposure value. Then, the unit 409 controls the aperture 403 in accordance with the obtained exposure value.

The camera control/arithmetic unit 409 then calculates the distance to an object by extracting high-frequency components on the basis of the signal output from the solid-state image sensing element 404. The unit 409 drives the lens to see if an in-focus state is attained. If it is determined that an in-focus state is not attached, the unit 409 drives the lens again to measure the distance. After an in-focus state is confirmed, the unit 409 starts main exposure.

Upon completion of exposure, an image signal output from the solid-state image sensing element 404 is A/D-converted by the A/D converter 406, and digital image data is written in the memory 410 via the signal processor 407 under the control of the camera control/arithmetic unit 409.

After that, the data stored in the memory 410 is recorded on the detachable recording medium 412 such as a semiconductor memory or the like via the recording medium control I/F 411 under the control of the camera control/arithmetic unit 409.

Also, image data may be directly input to a computer or the like via the external I/F 413 to process an image.

Note that the solid-state image sensing element using the photodiodes of a multi-layered structure can also be applied to any other image sensing-devices using area sensors in addition to the still video camera. Also, when the photodiodes may be arranged linearly to form a line sensor, they can be applied to image reading devices such as a scanner, facsimile, and the like. As can be understood by those who are skilled in the art, the present invention can be widely applied to various known devices using solid-state image sensing elements in addition to the above devices.

As described above, according to the present invention, upon reading out signals from a plurality of photodiode layers, highly color-separable signals which suffer less color mixture can be read out. Hence, the arithmetic operations required for color separation can be reduced or omitted, and noise components upon arithmetic operations can be suppressed more satisfactorily.

Also, the gains upon reading out respective color signals can be approximately uniform, and a high-quality image can be obtained by a simple process.

As many apparently widely different embodiments of the present invention can be made without departing from the spirit and scope thereof, it is to be understood that the invention is not limited to the specific embodiments thereof except as defined in the appended claims.

What is claimed is:

1. A photoelectric conversion element which is formed by alternately stacking a region of a first conductivity type and a region of a second conductivity type as a conductivity type opposite to the first conductivity type to form a multi-layered structure, in which a plurality of signals are output from junction surfaces between the neighboring regions of the first and second conductivity types comprising:

a surface semiconductor region of a conductivity type opposite to a conductivity type of a surface-side region of the junction surface closest to a surface formed in a surface of the surface-side region, said surface semiconductor region not being connected to a wire which is used to output the signals, and wherein concentrations of the stacked region of the first and second conductivity types are designed so that the stacked regions are depleted upon resetting the regions to a predetermined potential.

2. The element according to claim 1, further comprising a reset unit for resetting the stacked regions of the first and second conductivity types to the predetermined potential so as to deplete the regions.

3. The element according to claim 1, wherein said junction surfaces between the neighboring regions of the first and second conductivity types are formed to have depths suited to photoelectrically convert light in a plurality of different wavelength ranges, and which outputs signals for respective wavelength ranges.

4. A solid-state image sensing device formed by arranging a plurality of photoelectric conversion elements, wherein each of the photoelectric conversion elements has an arrangement of a photoelectric conversion element of claim 1.

5. The device according to claim 4, further comprising a reset unit for resetting the stacked regions of the first and second conductivity types to the predetermined potential so as to deplete the regions.

6. The device according to claim 4, further comprising: a plurality of electrodes used to extract electrical signals from respective regions of the respective photoelectric conversion elements; a plurality of switches connected to said plurality of electrodes; and amplifiers respectively connected to said plurality of electrodes.

7. A camera having a solid-state image sensing device of claim 4.

8. An image reading apparatus having a solid-state image sensing device of claim 4.

9. A solid-state image sensing device formed by arranging a plurality of first and second photoelectric conversion elements, each of which has an arrangement of a photoelectric conversion element, and outputs signals of a plurality of different wavelength ranges, wherein the first photoelectric conversion element photoelectrically converts light in first and second wavelength ranges, and the second photoelectric conversion element photoelectrically converts light in second and third wavelength ranges, and wherein each said photoelectric conversion element is formed by alternately stacking a region of a first conductivity type and a region of a second conductivity type as a conductivity type opposite to the first conductivity type to form a multi-layered structure, in which a plurality of signals are output from junction surfaces between the neighboring regions of the first and second conductivity types, and wherein each said photoelectric conversion element comprises a surface semiconductor region of a conductivity type opposite to a conductivity type of a surface-side region of the junction surface closest to a surface formed in a surface of the surface-side region, said surface semiconductor region not being connected to a wire which is used to output the signals.

10. The device according to claim 9, wherein the first photoelectric conversion element has a filter for intercepting light other than the first and second wavelength ranges, and the second photoelectric conversion element has a filter for intercepting light other than the second and third wavelength ranges.

11. A solid-state image sensing device formed by arranging a plurality of first photoelectric conversion elements each of which photoelectrically converts light in a first wavelength range, and a plurality of second photoelectric conversion elements each of which is formed by alternately stacking a region of a first conductivity type and a region of a second conductivity type as a conductivity type opposite to the first conductivity type to form a multi-layered structure, in which a plurality of signals are output from junction surfaces between the neighboring regions of the first and second conductivity types;

comprises a surface semiconductor region of a conductivity type opposite to a conductivity type of a surface-said region of the junction surface closest to a surface formed in a surface of the surface-side region, said surface semiconductor region not being connected to a wire which is used to output the signals; and photoelectrically converts light in second and third wavelength ranges.

12. The device according to claim 11, wherein the first photoelectric conversion element has a filter for intercepting light other than the first wavelength range on a surface thereof, and the second photoelectric conversion element has a filter for intercepting light in the first wavelength range on a surface thereof.

* * * * *